(12) United States Patent
Goswami et al.

(10) Patent No.: US 7,344,982 B2
(45) Date of Patent: Mar. 18, 2008

(54) SYSTEM AND METHOD OF SELECTIVELY DEPOSITING RUTHENIUM FILMS BY DIGITAL CHEMICAL VAPOR DEPOSITION

(75) Inventors: Jaydeb Goswami, Boise, ID (US); Sandwip Kumar Dey, Phoenix, AZ (US)

(73) Assignee: Arizona Board of Regents, acting for and on behalf of Arizona State University, Tempe, AZ (US)

( * ) Notice: Subject to any disclaimer, the term of this patent is extended or adjusted under 35 U.S.C. 154(b) by 13 days.

(21) Appl. No.: 10/996,591

(22) Filed: Nov. 23, 2004

(65) Prior Publication Data

US 2008/0038920 A1 Feb. 14, 2008

Related U.S. Application Data

(60) Provisional application No. 60/524,452, filed on Nov. 24, 2003.

(51) Int. Cl.
*H01L 21/44* (2006.01)
(52) U.S. Cl. ............... 438/680; 438/618; 438/674; 438/686; 257/E21.171
(58) Field of Classification Search .......... 438/680, 438/686, 618, 674
See application file for complete search history.

(56) References Cited

U.S. PATENT DOCUMENTS 6,824,816 B2 * 11/2004 Aaltonen et al. ........... 427/124

OTHER PUBLICATIONS

Dey et al, Growth and nanostructure of conformal ruthenium films by liquid source metalorganic chemical vapor dsposition, Journal of Applied Physics, vol. 94, Nr. 1, pp. 774-777.*
Dey et al, Growth and Nanostructure of Conformal Ruthenium Films by liwquid Source metalorganic Chemical Vapor Deposition, Journal of Applied Physics, vol. 94, Nr. 1, pp. 774-777.*
Aaltonen et al., "*Ruthenium Thin Films Grown by Atomic Layer Deposition*", Chem. Vap. Deposition, 9:45-49, 2003.
Auciello et al., "*Processing Technologies For Ferroelectric Thin Films and Heterostructures*", Annu. Rev. Mater. Sci., 28:501-531, 1998.

(Continued)

*Primary Examiner*—Alexander Ghyka
(74) *Attorney, Agent, or Firm*—McDonnell Boehnen Hulbert & Berghoff LLP

(57) ABSTRACT

A chemical vapor deposition reaction system converts a reactant precursor, which includes the metal Ruthenium, to a vapor during a chemical reaction in order to deposit the metal on a semiconductor wafer. The reactant precursor is Bis(2,2,6,6-tetramethyl-3,5-heptanedionato)(1,5-cyclooctadiene)Ru. An energy source provides energy to the reaction chamber to induce the chemical reaction. A controllable metering system alternatively supplies the precursor and oxygen to the reaction chamber. The precursor is supplied into the reaction chamber during a first phase and the oxygen is supplied into the reaction chamber during a second phase, which is non-overlapping with the first phase. A first pump/valve provides the precursor to the reaction chamber, and a second pump/valve provides the oxygen to the reaction chamber, each in response to a controller. The Ruthenium is selectively deposited on oxide sites patterned on a surface of the semiconductor wafer.

19 Claims, 3 Drawing Sheets

OTHER PUBLICATIONS

Bair et al., "*Quantification of Carbon in $Si_{1-x-y}Ge_xC_y$ with Uniform Profiles*", Nucl. Instr. and Meth in Phys. Res., 103:339-346, 1995.

Bhaskar et al., X-ray Photoelectron Spectroscopy and Micro-Raman Analysis of Conductive $RuO_2$ Thin Films, Appl. Phys., 89(5):2987-2992, 2001.

*CRC Handbook of Chemistry and Physics*, Lide, David R., Ed., CRC Press, pp. 12-45 through 12-108, 2002.

Dey et al., "*Ruthenium Films by Digital Chemical Vapor Deposition: Selectivity, Nanostructure, and Work Function*", J. Appl. Phys., 84(9):1606-1608, 2004.

Dey et al., "*Growth and Nanostructure of Conformal Ruthenium Films by Liquid-Source Metalorganic Chemical Vapor Deposition*", J. Appl. Phys. Let., 94:774-777, 2003.

Doolittle, L.R., "*Algorithms For the Rapid Simulation of Rutherford Backscattering Spectra*", Nucl. Instr. Meth. Phys. B9, pp. 344-351, 1985.

Goswami et al., "*MOCVD of Platinum Films from $(CH_3)_3CH_3CpPt$ and $Pt(acac)_2$: Nanostructure, Conformality, and Electrical Resistivity*", J. Mater. Res. 9(4):213-219, 2003.

Goswami et al., "*Highly (111)-Oriented and Conformal Iridium Films by Liquid Source Metalorganic Chemical Vapor Deposition*", Chem. Vap. Deposition, 16(8):2192-2195, 2001.

Green et al., "*Nucleation and Growth of Atomic Layer Deposited $HfO_2$ Gate Dielectric Layers on Chemical Oxide (Si-O-H) and Thermal Oxide ($SiO_2$ or Si-O-N) Underlayers*", J. Appl. Phys. 92(12)7168-7174, 2002.

Grill, A., "*Electrode Structures For Integration of Ferroelectric or High Dielectric Constant Films in Semiconductor Devices*", Mat. Res. Soc. Symp. Proc., 541:89-99, 1999.

Hwang, C.S., "*$(Ba,Sr)TiO_3$ Thin Films for Ultra Large Scale Dynamic Random Access Memory. A Review on the Process Integration*", Mat. Sci. Eng., B56, pp. 178-190, 1998.

Misra et al., "*Electrical Properties of Ru-Based Alloy Gate Electrodes for Dual Metal Gate Si-CMOS*", IEEE Electron Device Lett., 23(6):354-356, 2002.

Nakano et al., "*Digital Chemical Vapor Deposition of $SiO_2$*", Appl. Phys. Lett., 57(11):1096-1098, 1990.

Parkin et al., "Spin Engineering: Direct determination of the Ruderman-Kittel-Kasuya-Yosida far-field range function in ruthenium", Phys. Rev. B, 44(13):7131-7133, 1991.

Ritala et al., "*Atomic Layer Deposition*", Handbook of Thin Film Materials, (Ed. H. S. Nalwa), Academic Press, San Diego CA, pp. 103-159, 2001.

*The Chemistry of Metal CVD*, Kodas et al., Eds., VCH, Weinheim, pp. 275-339, 1994.

Wilk et al., "*High-k Gate Dielectrics: Current Status and Materials Properties Considerations*", J. Appl Phys., 89(10):5243-5275, 2001.

Zhong et al., "*Characterization of $RuO_2$ Electrodes on $ZrO_2$*", Appl. Phys. Lett., 78(8):1134-1136, 2001.

* cited by examiner

SYSTEM AND METHOD OF SELECTIVELY DEPOSITING RUTHENIUM FILMS BY DIGITAL CHEMICAL VAPOR DEPOSITION

CLAIM TO DOMESTIC PRIORITY

The present non-provisional patent application claims priority to provisional application Ser. No. 60/524,452 entitled "Selective Deposition of Ruthenium Films by Digital CVD", filed on Nov. 24, 2003, by Jaydeb Goswami et al.

STATEMENT REGARDING FEDERALLY-SPONSORED RESEARCH OR DEVELOPMENT

The U.S. Government has a paid-up license in the present invention and the right in limited circumstances to require the patent owner to license others on fair and reasonable terms as provided by the terms of Defense Advanced Research Projects Agency (DARPA) Grant No: 15428 and NSF-ECS Contract Number: ECS-0000121, as awarded by the Department of Defense.

FIELD OF THE INVENTION

The present invention relates in general to semiconductor manufacturing and, more particularly, to a system and method of selectively depositing Ruthenium films by digital chemical vapor deposition.

BACKGROUND OF THE INVENTION

Semiconductor devices are widely and commonly used in the construction of electronic circuits for many types of electronic products. The manufacturing of a semiconductor device typically involves growing a cylindrical-shaped silicon (or other base semiconductive material) ingot. The ingot is sliced into circular flat wafers. Through a number of thermal, chemical, and physical manufacturing processes, active semiconductor devices and passive devices are formed on one or both surfaces of the wafer. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

The active and passive semiconductor devices and associated structures are formed in part by either growing or depositing layers of material on the wafer surface. The growing process usually involves oxidation and nitridation. The depositing process may involve chemical vapor deposition (CVD), evaporation, or sputtering. In the typical CVD process, the wafer is placed in a CVD reaction chamber, e.g. tube furnace. The reaction chamber receives a controlled flow of a specific reactant chemical or precursor. The reaction chamber also receives an energy source, such as heat, induction RF, radiant, plasma, or ultraviolet, to induce a chemical reaction within the chamber. Inside the chamber, the atoms and molecules of the precursor chemical are mixed and reacted in the presence of the energy source to form a gas or vapor. The atoms from the vapor settle upon, i.e. are physically deposited on, the wafer surface to form a solid product or thin film from some component(s) of the precursor. During nucleation, the first few atoms of the chemical vapor come to rest in a uniform random distribution on the wafer surface. The deposited atoms then grow from small islands to larger islands. As more atoms are deposited, the islands merge together to coalesce into a continuous transition film having a thickness of hundreds of angstroms. The transition film grows into a bulk thin film having amorphous, single crystalline, or polycrystalline structure. The thickness of the bulk thin film is controlled by the reactant chemical flow, energy source, and duration of the reaction.

The layers of material deposited by CVD can form insulators and dielectrics (silicon dioxide, silicon nitrides), conductors (aluminum, aluminum-silicon alloys, aluminum-copper alloys, barrier metals, refractory metals, doped polysilicon), and semiconductor regions (epitaxial silicon and poly silicon) for the active and passive semiconductor components and devices. In some high speed and high density semiconductor processes, such as ultra-large-scale integrated (ULSI) circuits, it is desirable to deposit low-resistivity metals such as Cu, Ru, Pt, Ir, W, TiN, TaN, $WC_xN_y$, and $TaSi_xN_y$ on the wafer surface for use as high speed interconnects, barrier layers, and contact electrodes. In the CVD process, the metal thin film may be deposited over substantially the entire surface of the wafer. In later steps, the undesired portions of the metal thin film are removed by etching and cleaning, leaving the metal thin film in the desired locations. The etching process to remove the undesired metal thin film adds manufacturing costs and increases the chance of etch-induced damage.

A need exists for a manufacturable selective-CVD process which eliminates the post-CVD etching step to remove excess material, with its associated cost and potential for etch-induced damages.

SUMMARY OF THE INVENTION

In one embodiment, the present invention is a chemical vapor deposition reaction system comprising a reaction chamber, a source of reactant including Ruthenium, and a source of oxygen. A controllable metering system is coupled for receiving the source of reactant and the source of oxygen. The controllable metering system alternatively supplies the source of reactant and the source of oxygen to the reaction chamber.

In another embodiment, the present invention is a semiconductor deposition system comprising a reaction chamber. A controllable metering system is coupled for receiving first and second reactants. The controllable metering system alternatively supplies the first reactant and the second reactant to the reaction chamber.

In another embodiment, the present invention is a digital chemical vapor deposition system comprising a reaction chamber. A first metering assembly is coupled for receiving a first reactant. A second metering assembly is coupled for receiving a second reactant. A controller controls the first and second metering assemblies to supply the first reactant to the reaction chamber during a first phase and the second reactant to the reaction chamber during a second phase.

In another embodiment, the present invention is a method of making a semiconductor wafer comprising disposing the semiconductor wafer in a reaction chamber, and alternatively supplying first and second reactants to the reaction chamber to induce selective deposition of a component of the first reactant onto a surface of the semiconductor wafer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are widely and commonly used in the construction of electronic circuits for many types of electronic products. The manufacturing of a semiconductor device typically involves growing a cylindrical-shaped silicon (or other base semiconductive material) ingot. The ingot is sliced into circular flat wafers. Through a number of thermal, chemical, and physical manufacturing processes, active semiconductor devices and passive devices are formed on one or both surfaces of the wafer, and are interconnected. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

The semiconductor manufacturing process may begin with a rough polish to smooth the surface and remove any irregularities. To form the active and passive devices, the semiconductor wafer undergoes a layering process in which material is grown by oxidation or nitridation, or deposited by sputtering, evaporation, or chemical vapor deposition (CVD), on the surface of the wafer. The layering process further deposits metallization layers to interconnect the semiconductor devices. It is common to have five to six layers of metal in complex wafer designs.

The semiconductor wafer may receive a patterning process to remove selected portions of the previously grown or deposited material. Patterning can be implemented using photolithography, photomasking, and microlithography techniques and may involve application of photoresist and etching away of excess material. The layering and patterning processes are applied over and over again in order to form individual transistors, diodes, and other devices. In many cases, the patterning process defines the critical line dimensions of the wafer. The wafer is subjected to a doping process to inject certain quantities of dopants into the semiconductor devices to alter their electrical characteristics. Dopants can be injected by thermal diffusion or ion implantation.

Figure 1:
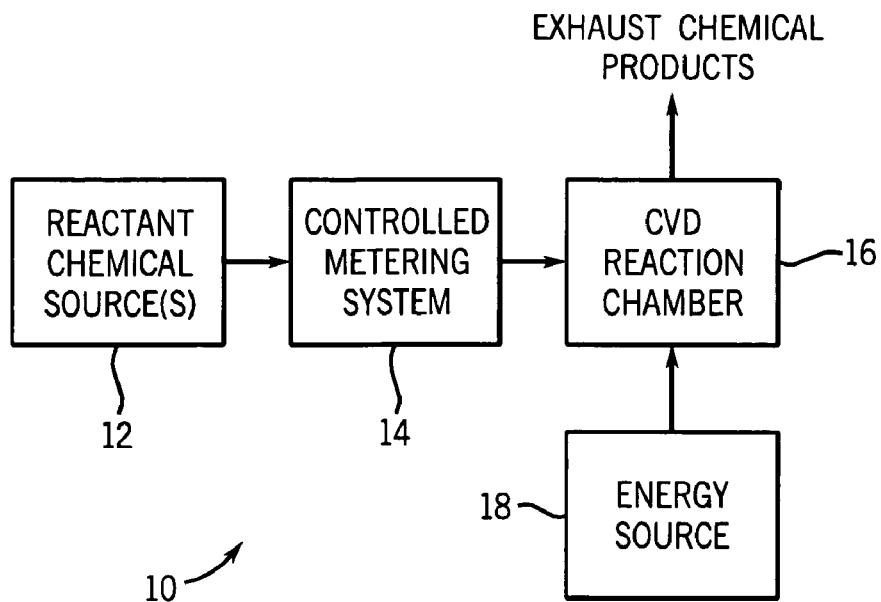
FIG. 1 illustrates a CVD chamber with controlled reactant metering system.

The present invention is primarily concerned with the CVD process during the manufacture of the semiconductor wafer. A CVD processing system 10 is shown in FIG. 1. A first reactant chemical is provided by reactant chemical source(s) 12. The reactant chemical is a precursor and contains the chemical element(s) intended to be deposited, as well as other chemical elements. Controlled metering system 14 supplies the proper quantity and timing of reactant chemical sources 12 to CVD reaction chamber 16, i.e. the reaction chamber receives a controlled flow, in terms of quantity and timing of the reactant chemical, as described hereinafter. The semiconductor wafers are placed in CVD reaction chamber 16. In one embodiment, CVD reaction chamber 16 is a tube furnace. Energy source 18 provides energy, such as heat, induction RF, radiant, plasma, or ultraviolet, into CVD reaction chamber 16 to induce a chemical reaction within the chamber.

Within CVD reaction chamber 16, the atoms and molecules of the reactant chemical precursor are mixed and reacted in the presence of the energy source to form a gas or vapor. The chemical reaction in CVD reaction chamber 16 involves a separation of the precursor into atoms of the element to be deposited from other elements of the precursor which are not intended to be deposited. The non-deposited elements are exhausted from the chamber as by-products. The atoms from the element to be deposited settle upon, i.e. are physically deposited on, the semiconductor wafer surface to form a solid product or thin film from some component from the reactant chemical. During nucleation, the first few atoms of the chemical vapor come to rest in a uniform random distribution on the wafer surface. The deposited atoms grow from small islands to larger islands. As more atoms are deposited, the islands merge together to coalesce into a continuous transition film having a thickness of hundreds of angstroms. The transition film grows into a bulk thin film having amorphous, single crystalline, or polycrystalline structure. The thickness of the bulk thin film is controlled by the controlled chemical flow, energy source, and duration of the reaction.

In one embodiment, the reactant chemical precursor is Bis(2,2,6,6-tetramethyl-3,5-heptanedionato)(1,5-cyclooctadiene)Ru, hereinafter referred to as Ru(THD)$_2$COD. The precursor contains the metal Ruthenium (Ru). Ru is a hard noble metal with a hexagonal close-packed crystal structure. Ru belongs to group 8, period 5; precious metal or Platinum group metal. Ru is typically available in powder form and is often used as an alloying agent. Ru can be plated by electro-deposition or by thermal decomposition methods. The metal is an effective hardener for platinum and palladium, and can be alloyed with these metals to make low-resistivity electrical contacts. Alternatively, the reactant chemical precursor can contain Cu, Pt, Ir, W, TiN, TaN, WC$_x$N$_y$, or TaSi$_x$N$_y$, for depositing on the semiconductor wafer. These materials are useful in forming low-resistivity conductors, interconnects, barrier layers, and contact electrodes in ultra-large-scale integrated (ULSI) circuits.

Figure 2:
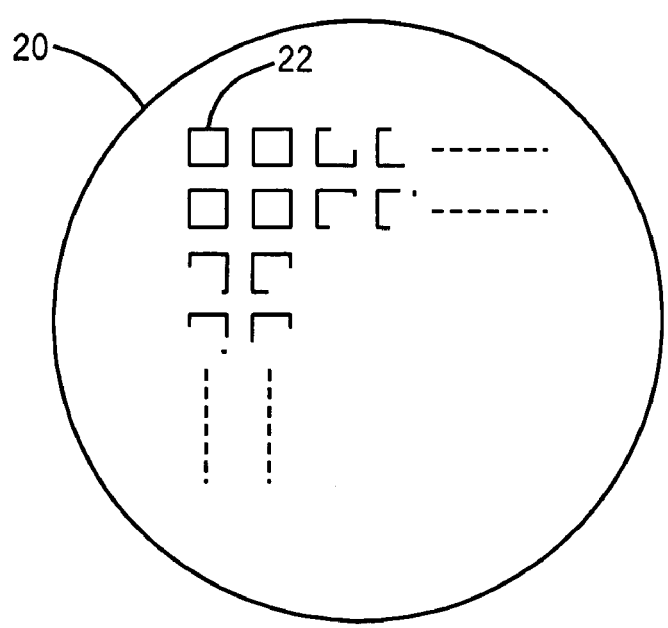
FIG. 2 illustrates a semiconductor wafer with semiconductor die.

In FIG. 2, semiconductor wafer 20 may be formed with any base technology, such as silicon and gallium arsenide, and with any device density and level of integration. Semiconductor wafer 20 is widely used in the construction of electronic circuits for many types of electronic products. Semiconductor wafer 20 comprising a number of die 22. Die 22 are manufactured to comprise one or more semiconductor devices. The CVD process in FIG. 1 is used to form at least a portion of the semiconductor devices on wafer 20. Each die 22 is cut from the wafer, mounted on a leadframe, encapsulated in a package, and sold as a discrete or integrated circuit chip. Die are also used in "Flip Chip" applications, in which they are directly bonded to the circuit board without the leadframe.

Figure 3:
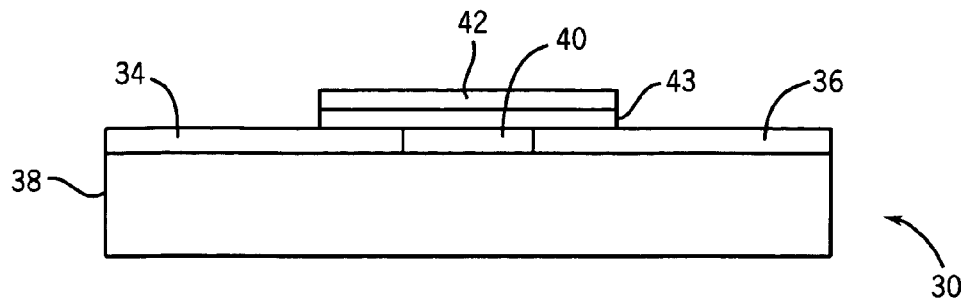
FIG. 3 illustrates a semiconductor device with interconnecting metal layer as deposited in the CVD chamber.

In FIG. 3, a cross-sectional view of semiconductor device 30 on one of die 22 is shown following CVD processing of FIG. 1. Active regions 34 and 36 are formed on substrate 38, separated by isolation region 40. Insulation region 40 is made from silicon dioxide ($SiO_2$). Active region 34 may be the drain or source region of a first metal oxide semiconductor field effect transistor (MOSFET) and active region 36 may be the drain or source region of a second MOSFET formed on substrate 38. Assume the circuit function requires active region 34 to be electrically connected to active region 36. The deposition process described herein selectively deposits Ru to form metal interconnect 42 on the surface of the semiconductor wafer. The deposition is selective because the metal Ru bonds only to oxide layer 43, which has been patterned between active regions 34 and 36 on the surface of the wafer. Metal interconnect 42 electrically connects through vias in oxide layer 43 to active regions 34 and 36 in order to route signals between the first and second MOSFETs. Metal interconnect 42 is formed using the low-resistivity Ru material in CVD reaction chamber 16. Ru metal is desirable for many applications, including ULSI, due to its low bulk resistivity (7.2 $\mu\Omega$-cm at 25° C.), high-speed signal propagation, high chemical inertness and thermal stability, hardness of 6.5 on the Mhos scale, and high melting point (2427° C.).

Ruthenium has many potential applications in microelectronics area. For example, Ru oxide ($RuO_x$) is a diffusion barrier as well as an electrical conductor. The dense, conformal, and conductive Ru films are applicable to high-temperature barrier and contact electrodes for random access memories (RAMs) based on perovskite-based capacitors, e.g. $Ba_xSr_{1-x}TiO_3$, $PbZr_xTi_{1-x}O_3$, $SrBi_2Ta_2O_9$. Moreover, Ru with its high work function of about 5 eV and high dielectric permittivity can be used as a gate metal on high permittivity (K) gate-oxides, e.g., $HfO_2$, $ZrO_2$, $LaAlO_3$, in p-channel metal-oxide semiconductor (MOS) devices with equivalent $SiO_2$ thickness (EOT) less than 1.0 nm. The ultra-thin films of Ru can be used in magnetic recording media and ferromagnetic random access memories.

The present discussion considers selective deposition of Ru on patterned $HfO_2/SiO_x/Si$ wafers using a liquid-source metalorganic chemical vapor deposition (LS-MOCVD) technique. The selective deposition is referred to as a digital CVD (DCVD) process in which the precursors/reactants are alternately delivered to the semiconductor wafer in the reaction chamber. In a first phase, the $Ru(THD)_2COD$ precursor is delivered from reactant chemical source 12 to CVD reaction chamber 16. In a second phase, oxygen ($O_2$) or other reactant to the precursor is delivered from reactant chemical source 12 to CVD reaction chamber 16.

Figure 4:
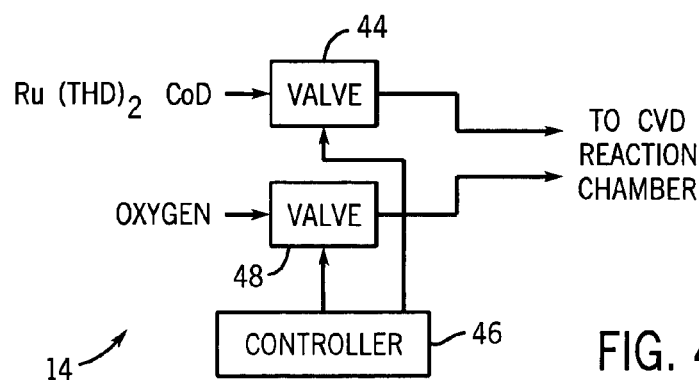
FIG. 4 illustrates further detail of the controlled metering system of FIG. 1.

The alternate delivery is shown with the further detail of controlled metering system 14 in FIG. 4. High-speed micro-pump/valve 44 operates as a metering assembly to meter or deliver the $Ru(THD)_2COD$ precursor under pressure into CVD reaction chamber 16 under control of controller 46. Likewise, high-speed micro-pump/valve 48 operates as a metering assembly to meter or deliver the $O_2$ under pressure into CVD reaction chamber 16 under control of controller 46. The $O_2$ may be delivered into CVD reaction chamber 16 through a port separate from the $Ru(THD)_2COD$ precursor. Controller 46 controls the flow rate, timing, and interval between the operation of pump/valves 44 and 48.

For a given cycle, at time $t_1$, controller 46 opens or enables pump/valve 44. The $Ru(THD)_2COD$ precursor flows into CVD reaction chamber 16 as governed by pump/valve 44 under control of controller 46. At time $t_2$, controller 46 closes or disables pump/valve 44. The $Ru(THD)_2COD$ precursor stops flowing to CVD reaction chamber 16. The reaction chamber may be purged with Argon (Ar) or other inert gas between times $t_2$ and $t_3$. At time $t_3$, controller 46 opens or enables pump/valve 48. The $O_2$ flows into CVD reaction chamber 16 as governed by pump/valve 48 under control of controller 46. At time $t_4$, controller 46 closes or disables pump/valve 48. The $O_2$ stops flowing to CVD reaction chamber 16.

The alternate phases of delivery of precursor containing Ru and oxygen into reaction chamber promotes adhesion of Ru on the wafer surface in a selective manner and suppresses any gas-phase reaction. The selective manner arises from the alternate phases of precursor and oxygen in the reaction chamber causing the Ru to bond to patterned oxide sites on the wafer surface. The selective DCVD process of Ru on patterned oxide sites on the wafer surface eliminates the etching step and consequentially, etch-induced damages, and reduces the cost of metallization in advanced semiconductor devices.

The process of forming Ru thin films in CVD reaction chamber 16 is described as follows. The deposition of Ru films can be carried out in a low-pressure, horizontal CVD reactor with hot-walls. The CVD reaction chamber 16 is set to a temperature ($T_{SUB}$) of 280-320° C. and a reactor pressure of 100 mTorr in order to deposit Ru thin films in the range of 14-200 nm in thickness. The solid $Ru(THD)_2COD$ precursor is dissolved in tetrahydrofuran at room temperature forming a liquid source of 0.08 M concentration.

During the first reaction phase, the $Ru(THD)_2COD$ precursor is vaporized for delivery into the reaction chamber. A precision micro-pump is used to inject the liquid source, with a selected flow rate (0.2 ml/min), into a vaporizer kept in close proximity to the reactor chamber. The liquid-source delivery process is a reproducible technique with advantages of steady precursor flow and uniform growth rates. Accordingly, the $Ru(THD)_2COD$ precursor is delivered through pump/valve 44 into CVD reaction chamber 16 during a controlled pulse of reactant ($\Delta t_{Ru}$). The vaporized precursor is delivered over the wafer surface. In order to remove excess reactants and reaction by-products from the reactor, an Ar purge at 280 standard cubic centimeter/meter (sccm) for a pulse time ($\Delta t_{Ar}$) of 2 seconds is used after each reactant pulse. After an Ar purge, the $O_2$ is delivered through pump/valve 48 into CVD reaction chamber 16 during a controlled pulse of reactant ($\Delta t_{Ox}$). Oxygen is introduced into the reaction chamber at 50 sccm. The delivery pulses $\Delta t_{Ru}$ and $\Delta t_{Ox}$ into CVD reaction chamber 16 can be varied between 2-10 seconds. Thus, one cycle of deposition is defined as the time or delivery pulses $\Delta t_{Ru} + \Delta t_{Ar} + \Delta t_{Ox} + \Delta t_{Ar}$.

Figure 5:
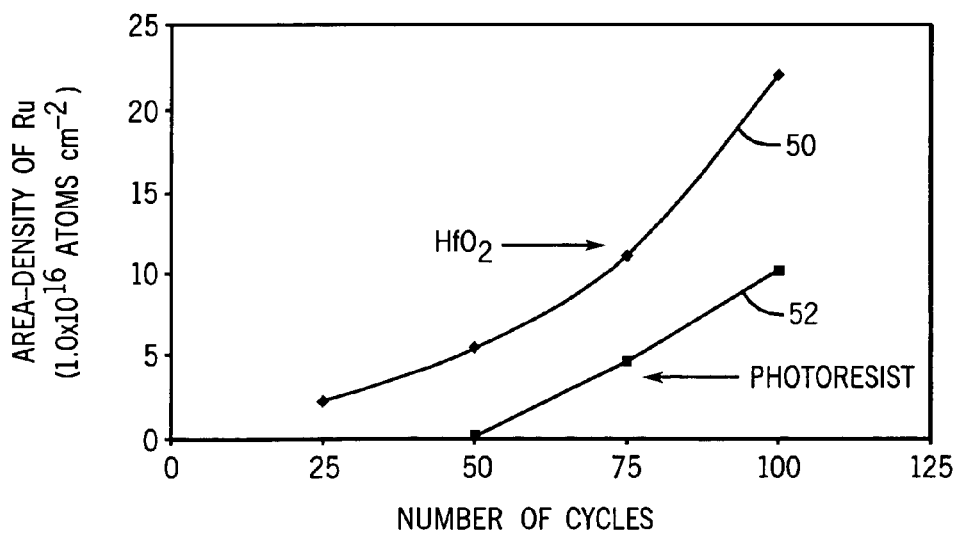
FIG. 5 illustrates a plot of Ru density as a function of growth cycle for ALD-HfO$_2$ and photoresist.

During one deposition cycle, the Ru is deposited on patterned oxide sites of the semiconductor wafer. The deposition is selective because the Ru bonds only to locations of oxide created on the patterned wafer surface. The selective deposition of Ru can be achieved by using different regions on the semiconductor substrate having different barriers for nucleation and growth. The deposition of Ru by DCVD is carried out on a variety of surfaces including photoresist and atomic layer deposited $HfO_2$. Ru coverage, as measured by Rutherford backscattering spectroscopy (RBS), is used to determine the number of Ru atoms deposited per unit area for a given number of growth cycles. The Ru coverage as a function of growth cycle, for ALD-$HfO_2$ and photoresist is shown as plots 50 and 52, respectively, in FIG. 5 with $T_{sub}$=320° C., $\Delta t_{Ru}$=10 sec, and $\Delta t_{Ox}$=2 sec. Generally, after an initial period a nonlinear growth of Ru, the growth rate rapidly increases due to autocatalysis by the nucleated Ru clusters. However, compared to atomic layer deposition (ALD)-HfO$_2$, the growth rate on photoresist is initially slower, resulting in a longer induction period of nucleation. For example, the deposition of a measurable amount of Ru on photoresist required 50 cycles compared to 25 cycles for ALD-HfO$_2$. The Ru nucleation barrier is considerably higher on photoresist compared to ALD-HfO$_2$.

The Ru films are selectively deposited on the exposed areas of ALD-HfO$_2$/SiO$_x$/Si wafers patterned with a photoresist. Standard photolithography is used to define a photoresist pattern onto the wafer such that the dimension of the exposed ALD-HfO$_2$ is between $1\times10^4$ and $1.6\times10^5$ μm$^2$ and the pitch is 400-800 μm. The selectivity can be analyzed using field-emission scanning electron microscopy (FESEM) and Energy Dispersive X-ray Spectroscopy (EDS). The nucleation and growth rates of Ru are significantly higher on the ALD-HfO$_2$ surface, with a few Ru particles scattered on the photoresist surface. The preferential or selective growth of Ru on the exposed ALD-HfO$_2$ surface is again reflected in the high intensity of Ru-L$_\alpha$ and low intensity of C-K$_\alpha$.

The ease of Ru nucleation on ALD-HfO$_2$ may be due to the presence of much greater amount of surface hydroxyl groups compared to photoresist. Indeed, contact angle measurements of water on ALD-HfO$_2$ showed a lower angle of about 50° compared to 70° for photoresist, indicating more hydrophilic nature of ALD-HfO$_2$. In the early stages of growth, due to the reaction between Ru(THD)$_2$COD and OH-terminated oxide surfaces, the reaction rate is considerably higher on ALD-HfO$_2$ compared to photoresist. Accordingly, the hydroxyl groups on the ALD-HfO$_2$ surface are potential sites for the exchange reaction of Ru(THD)$_2$COD, which may be represented by the following reactions:

$$Ru(THD)_2COD + {}^*OH \rightarrow {}^*ORu(THD)COD + H\text{-}THD \qquad (1)$$

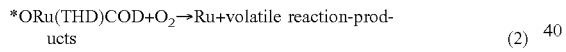
$$^*ORu(THD)COD + O_2 \rightarrow Ru + \text{volatile reaction-products} \qquad (2)$$

First, the precursor molecule reacts with the hydroxyl terminated ALD-HfO$_2$, releasing the volatile H-THD molecule. Next, oxygen reacts with the chemisorbed precursor, liberating the residual ligands as volatile by-products, and forms the Ru seed layer for subsequent growth. The lack of hydroxyl groups on the photoresist surface does not favor the above reactions, thereby increasing the induction period of Ru nucleation.

Figure 6:
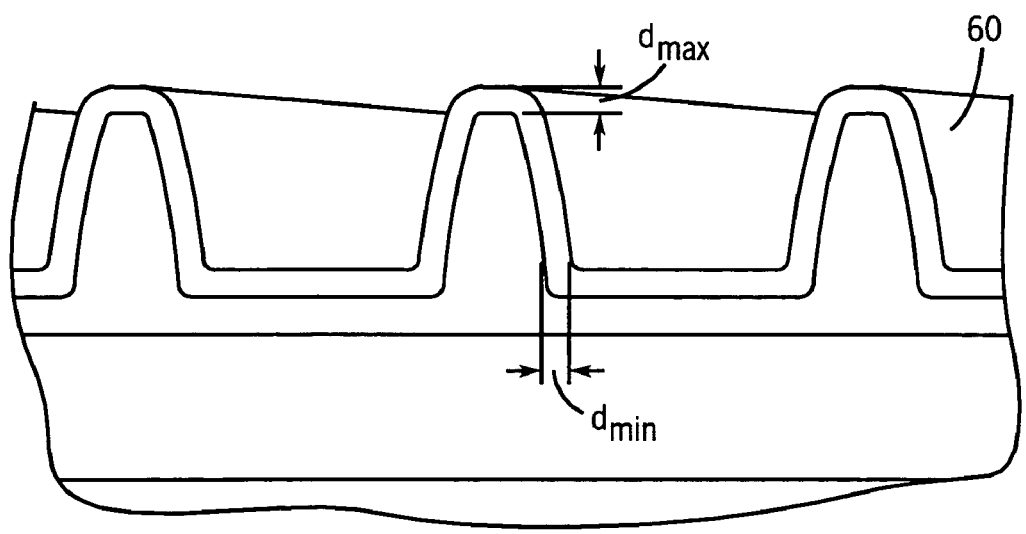
FIG. 6 is a cross-sectional FESEM images showing conformal coverage of Ru on a patterned silicon dioxide wafer.

The step-coverage property of Ru films can be viewed using patterned SiO$_2$/Si substrates. The degree of step-coverage is determined by the percent conformality, defined as $(d_{min}/d_{max})\times100$, where $d_{max}$ and $d_{min}$ are the film thicknesses at the top surface and at the bottom of the sidewall surface, respectively. FIG. 6 shows a cross-sectional FESEM micrograph of a highly conformal (nearly 100%) Ru film deposited at 290° C., illustrating dense and smooth morphology both on the top and sidewall surfaces 60. The deliver pulse times are $\Delta t_{Ru}$=10 sec and $\Delta t_{Ox}$=10 sec, and number of growth cycles is set to 250.

Figure 7:
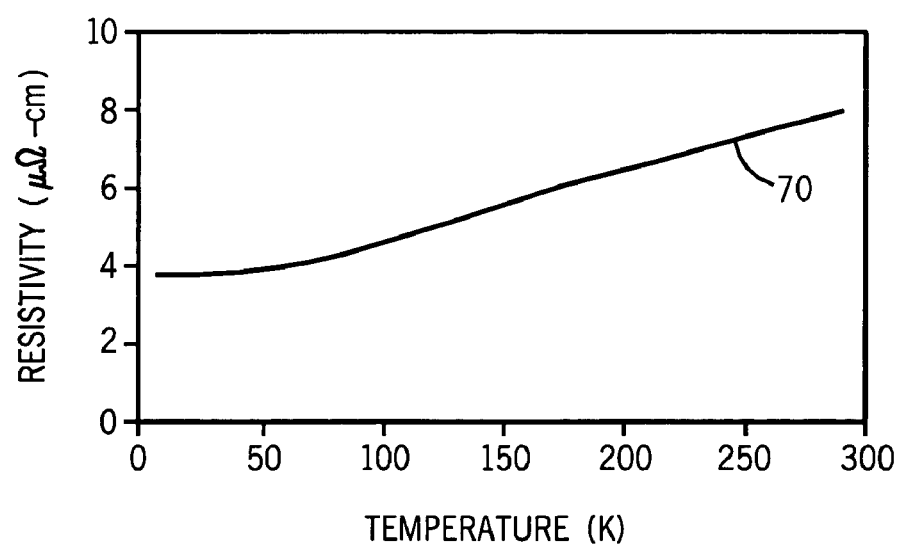
FIG. 7 illustrates a plot of temperature dependence of electrical resistivity of Ru films.

Generally, Ru films showed a positive temperature coefficient of resistivity (ρ), indicating metallic-type conduction through electrically continuous grains. FIG. 7 illustrates plot 70 showing the temperature dependence (4.2-272 K) of the ρ of an as-deposited, 42-nm-thick Ru-film with $T_{sub}$=320° C., $\Delta t_{Ru}$=10 sec, $\Delta t_{Ox}$=2 sec, and number of growth cycles set to 125. The values of ρ at 272 K, residual resistivity ($\rho_R$) at 4.2 K, and residual resistivity ratio (RRR=$\rho_{272\,K}/\rho_{4.2\,K}$) are 20.6 μΩ-cm, 11.9 μΩ-cm, and 1.7, respectively. The large value of $\rho_R$ is due the presence of amorphous RuO$_x$ at the grain boundaries of the Ru film, as illustrated by RBS and XPS data.

In summary, a novel process has been disclosed to achieve selective deposition of Ru films by a liquid-source digital-CVD technique using alternate exposures of Ru(THD)$_2$COD precursor and oxygen in the reaction chamber. The precursor is delivered during a first phase, and the oxygen is delivered during a second phase of the deposition cycle. The Ru films are selectively deposited on patterned oxide sites of the wafer surface, e.g. an exposed area of hydroxyl-terminated ALD-HfO$_2$ surfaces. In general, Ru films are dense and polycrystalline, and showed a low electrical resistivity of 20.6 μΩ-cm at 272 K.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor wafer, comprising:
   disposing the semiconductor wafer in a reaction chamber, the semiconductor wafer having an oxide layer defined by a pattern; and
   alternately supplying ruthenium and oxygen into the reaction chamber to induce selective deposition of the ruthenium onto a surface of the semiconductor wafer, wherein the selective deposition bonds the ruthenium only to the patterned oxide layer on the surface of the semiconductor wafer while inhibiting the bonding of ruthenium to any other area of the surface of the semiconductor wafer in order to form a metal interconnect on the surface of the semiconductor wafer as defined by the pattern, the step of alternately supplying the ruthenium and oxygen including the steps of,
   (a) enabling a flow of the ruthenium into the reaction chamber during a first time period,
   (b) disabling the flow of the ruthenium into the reaction chamber at an end of the first time period,
   (c) enabling a flow of the oxygen into the reaction chamber during a second time period which occurs after the end of the first time period,
   (d) disabling the flow of the oxygen into the reaction chamber at an end of the second time period,
   (e) enabling the flow of the ruthenium during a third time period which occurs after the end of the second time period,
   (f) disabling the flow of the ruthenium into the reaction chamber at an end of the third time period,
   (g) enabling the flow of the oxygen into the reaction chamber during a fourth time period which occurs after the end of the third time period, and
   (h) disabling the flow of the oxygen into the reaction chamber at an end of the fourth time period.

2. The method of claim 1, further including:
   controlling a first metering assembly to deliver the ruthenium to the reaction chamber; and
   controlling a second metering assembly to deliver the oxygen to the reaction chamber.

3. The method of claim 1, further including purging the reactant chamber with an inert gas between the first and second time periods.

4. A method of making a semiconductor wafer, comprising:

disposing the semiconductor wafer in a reaction chamber, the semiconductor wafer having an oxide layer defined by a pattern; and repeating a deposition cycle of,
- (a) enabling a flow of a first reactant into the reaction chamber during a first time period,
- (b) disabling the flow of the first reactant into the reaction chamber at an end of the first time period,
- (c) enabling a flow of a second reactant into the reaction chamber during a second time period which occurs after the end of the first time period, and
- (d) disabling the flow of the second reactant into the reaction chamber at an end of the second time period, wherein alternately enabling and disabling the first and second reactants into the reaction chamber induces selective deposition of a component of the first reactant onto a surface of the semiconductor wafer, the selective deposition bonding the component of the first reactant only to the patterned oxide layer on the surface of the semiconductor wafer while inhibiting the bonding of the component of the first reactant to any other area of the surface of the semiconductor wafer in order to form a metal interconnect on the surface of the semiconductor wafer as defined by the pattern.

5. The method of claim 4, wherein the first reactant includes Ruthenium.

6. The method of claim 4, wherein the first reactant includes Bis(2,2,6,6-tetramethyl-3,5-heptanedionato)(1,5-cyclooctadiene)Ru.

7. The method of claim 4, wherein the second reactant includes oxygen.

8. The method of claim 4, further including:
controlling a first metering assembly to deliver the first reactant to the reaction chamber; and
controlling a second metering assembly to deliver the oxygen to the reaction chamber.

9. The method of claim 4, further including purging the reactant chamber with an inert gas between the first and second time periods.

10. A method of making a semiconductor wafer, comprising:
disposing the semiconductor wafer in a reaction chamber, the semiconductor wafer having an oxide layer defined by a pattern; and
repeating a deposition cycle of,
- (a) enabling a flow of a mixture including ruthenium into the reaction chamber during a first time period,
- (b) disabling the flow of the mixture into the reaction chamber at an end of the first time period,
- (c) enabling a flow of oxygen into the reaction chamber during a second time period which occurs after the end of the first time period, and
- (d) disabling the flow of the oxygen into the reaction chamber at an end of the second time period, wherein alternately enabling and disabling the flow the mixture and oxygen into the reaction chamber induces selective deposition of the ruthenium onto a surface of the semiconductor wafer, the selective deposition bonding the ruthenium only to the patterned oxide layer on the surface of the semiconductor wafer to form a metal interconnect on the surface of the semiconductor wafer as defined by the pattern.

11. The method of claim 10, wherein the mixture includes Bis(2,2,6,6-tetramethyl-3,5-heptanedionato)(1,5-cyclooctadiene)Ru.

12. The method of claim 10, further including:
controlling a first metering assembly to deliver the ruthenium to the reaction chamber; and
controlling a second metering assembly to deliver the oxygen to the reaction chamber.

13. The method of claim 10, further including purging the reactant chamber with an inert gas between the first and second time periods.

14. A method of making a semiconductor wafer, comprising:
disposing the semiconductor wafer in a reaction chamber, the semiconductor wafer having an oxide layer defined by a pattern; and
repeating a deposition cycle of alternately enabling a flow of a first reactant into the reaction chamber during a first time period and enabling a flow of a second reactant into the reaction chamber during a second time period which occurs after the first time period, wherein alternately enabling and disabling the first and second reactants into the reaction chamber induces selective deposition of a component of the first reactant onto a surface of the semiconductor wafer, the selective deposition bonding the component of the first reactant only to the patterned oxide layer on the surface of the semiconductor wafer to form a metal interconnect on the surface of the semiconductor wafer as defined by the pattern.

15. The method of claim 14, wherein the first reactant includes Ruthenium.

16. The method of claim 14, wherein the first reactant includes Bis(2,2,6,6-tetramethyl-3,5-heptanedionato)(1,5-cyclooctadiene)Ru.

17. The method of claim 14, wherein the second reactant includes oxygen.

18. The method of claim 14, further including:
controlling a first metering assembly to deliver the first reactant to the reaction chamber; and
controlling a second metering assembly to deliver the oxygen to the reaction chamber.

19. The method of claim 14, further including purging the reactant chamber with an inert gas between the first and second time periods.

* * * * *